United States Patent [19]
Tzu et al.

[11] Patent Number: 6,051,347
[45] Date of Patent: Apr. 18, 2000

[54] APPLICATION OF E-BEAM PROXIMITY OVER-CORRECTION TO COMPENSATE OPTICAL PROXIMITY EFFECT IN OPTICAL LITHOGRAPHY PROCESS

[75] Inventors: San-De Tzu, Taipei; Chia-Hui Lin, Hsin-Chu, both of Taiwan

[73] Assignee: Taiwan Semiconductor Manufacturing Company, Hsin-Chu, Taiwan

[21] Appl. No.: 09/270,595

[22] Filed: Mar. 18, 1999

[51] Int. Cl.$^7$ ........................................................ G03C 5/00
[52] U.S. Cl. ............................ 430/30; 430/296; 430/942
[58] Field of Search ............................... 430/30, 296, 942

[56] References Cited

U.S. PATENT DOCUMENTS

| | | | |
|---|---|---|---|
| 4,988,284 | 1/1991 | LiU et al. | 430/296 |
| 5,532,496 | 7/1996 | Gaston | 250/492.22 |
| 5,657,235 | 8/1997 | Liebmann et al. | 364/474.24 |
| 5,665,968 | 9/1997 | Meisburger et al. | 250/310 |
| 5,717,204 | 2/1998 | Meisburger et al. | 250/310 |
| 5,736,281 | 4/1998 | Watson | 430/30 |
| 5,740,068 | 4/1998 | Liebmann et al. | 364/489 |

OTHER PUBLICATIONS

Wolf et al., "Silicon Processing for the VLSI Era", vol. 1: Process Technology, Lattice Press, Sunset Beach, CA, 1986, p. 500.

*Primary Examiner*—Christopher G. Young
*Attorney, Agent, or Firm*—George O. Saile; Stephen B. Ackerman

[57] ABSTRACT

A method of correcting, or compensating for errors encountered in the transfer of patterns is disclosed for use with high resolution e-beam lithography. In a first embodiment, optical proximity effects are incorporated into the e-beam proximity effects by superimposing the two effects to arrive at a compensated dosage level database to produce the desired patterns. In a second embodiment, etching effects are also superimposed on the previous driving database by compensating the e-beam proximity data twice, that is, by over correcting it, to further improve the transfer of patterns without the undesirable effects. It is shown that corrections for a number of other process steps can also be incorporated into the database that drives the e-beam lithography machine in order to achieve high resolution patterns of about one-quarter-micron technology.

32 Claims, 8 Drawing Sheets

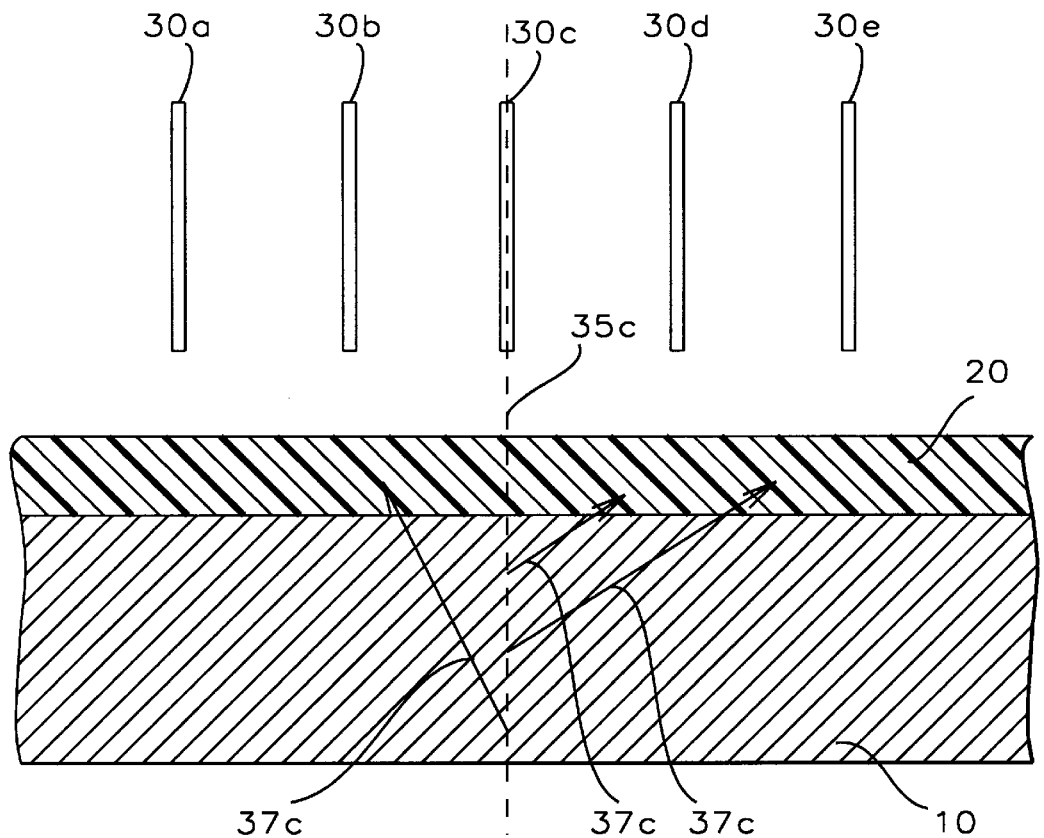
FIG. 1a – Prior Art
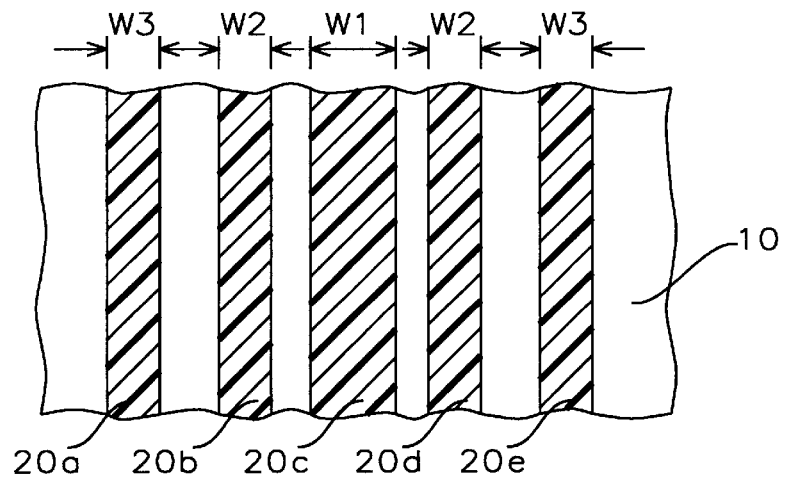
FIG. 1b – Prior Art

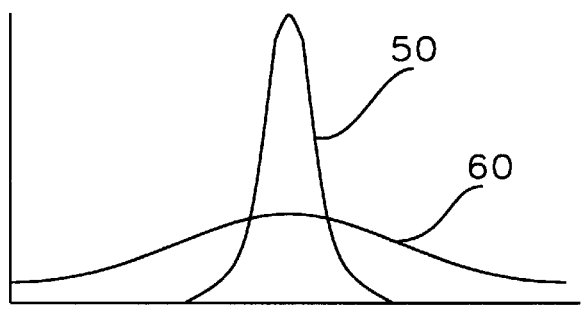
FIG. 2a - Prior Art
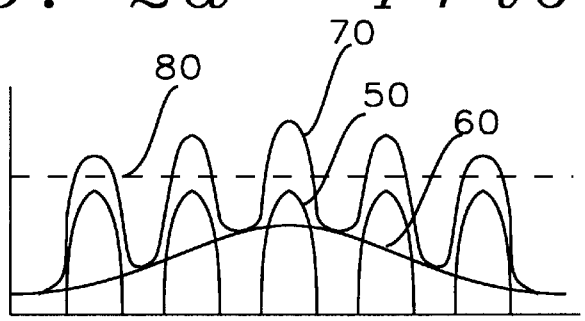
FIG. 2b - Prior Art
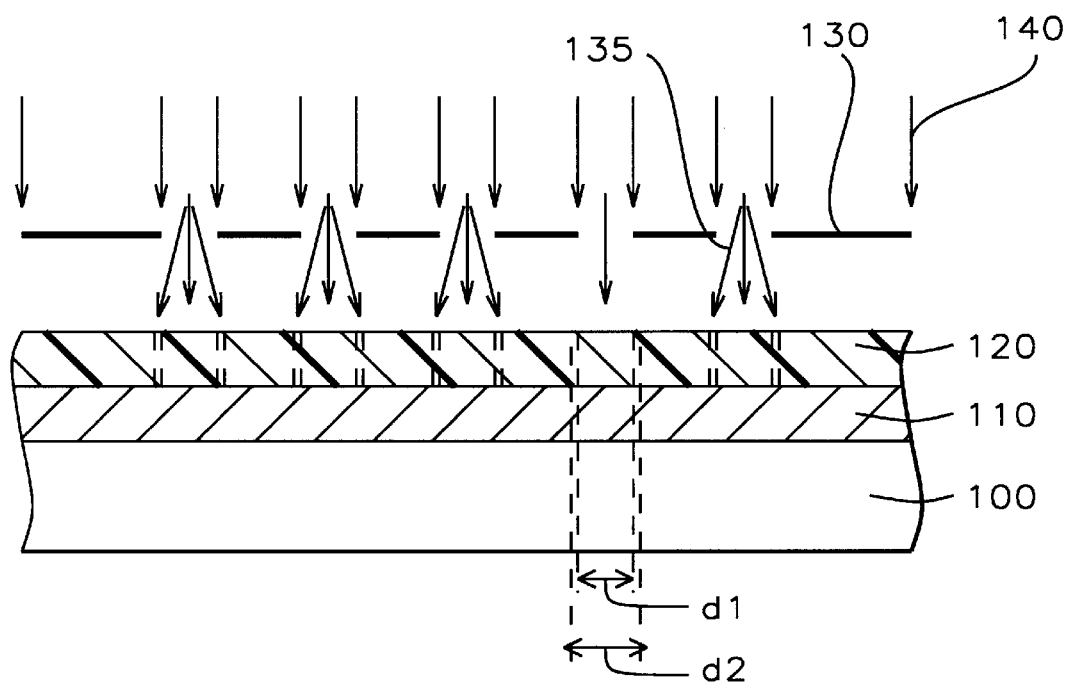
FIG. 3a

APPLICATION OF E-BEAM PROXIMITY OVER-CORRECTION TO COMPENSATE OPTICAL PROXIMITY EFFECT IN OPTICAL LITHOGRAPHY PROCESS

BACKGROUND OF THE INVENTION

(1) Field of the Invention

The present invention relates to the lithographic methods in the manufacture of integrated circuits in general, and in particular, to a method of compensating for optical proximity effect through the application of over-correction of electron beam proximity effect.

(2) Description of the Related Art

The manufacture of integrated circuits involve the forming of myriad of components on a semiconductor substrate, such as a wafer of silicon. The components may include devices themselves, metal lines, metal plugs, and other features that, together, comprise the circuits. The patterns that define such regions of components are created by lithographic processes. That is, layers of photoresist materials are first spin-coated onto the wafer substrate. Next, the resist layer is selectively exposed to a form of radiation, such as ultraviolet light, electrons, or x-rays. An exposure tool and mask, or data tape in electron beam lithography, are used to effect the desired selective exposure. The patterns in the resist are formed when the wafer undergoes the subsequent "development" step. The areas of resist remaining after development protect the substrate regions which they cover. Locations from which resist has been removed can be subjected to a variety of additive (deposition) or subtractive (etch) processes that transfer the pattern onto the substrate surface.

Because of the many transfer steps that are involved from the time the patterns are generated in a computer-using computer aided design (CAD) techniques- to the time the patterns are actually formed in a semiconductor wafer, the images formed on the device substrate deviate from their ideal dimensions and shape as represented by the computer images. These deviations depend on the characteristics of the patterns as well as on the various process conditions. Because these deviations can significantly effect the performance of the semiconductor device, workers in the field have pursued many different approaches to correct such deviations by compensating for those deviations at certain process steps. Usually, and as described more fully below, the corrective compensation is introduced either into the CAD (Computer Aided Design) generated patterns in the beginning, or at the masking process step where mask patterns are selectively biased, to compensate for the pattern distortions occurring during wafer processing. The term Optical Proximity Correction (OPC) is commonly used to describe the latter technique of selective mask biasing. The concept of biasing patterns to compensate for image transfer distortions has been commonly applied to E-beam lithography to counteract the effects of back scattered electrons, both in the writing of photomasks and in direct wafer writing operations. It is disclosed in the present invention, a method of compensating for optical proximity effect through the application of over-correction for electron beam proximity effect.

Compensation schemes of prior art have been primarily directed towards manipulating the computer images by adding, subtracting, or biasing design features as discussed by Liebmann in U.S. Pat. No. 5,657,235. In a typical compensation scheme, CAD data in a hierarchical format using a discrete design grid is created which represents the ideal device patterns. Compensation information based on known patterning distortions is defined in a "lookup" table or convolution function. Manipulation of the CAD data based on the distortion knowledge is performed with an optical proximity correction (OPC) engine which outputs biased CAD data. The output data contains reduced hierarchy and design grid in order to allow for the appropriate compensations. The biased CAD data is then converted to a flat format for photomask fabrication. Realizing that modifications of the design with computer programs can sometimes over-burden computer systems, Liebmann provides a method of correcting pattern sizes and shapes by assigning relative energy levels to the radiation used during the mask process, rather than physically manipulating feature sizes in the computer layout design. As it will be known to those skilled in the art, many parameters effect the size of images created during the mask process, such as incident energy level, duration of development, or duration of the etch step employed. Processes such as development or etch effect all regions of the photomask and are used to adjust the average size of all the features contained in the design. Energy level or dose is controlled by the exposure system which can selectively apply an energy level to any particular pattern needing compensation. Thus, Liebmann codes relative dose information onto the design data thereby compensating specific mask feature sizes through dose offsets during the mask exposure process. These offsets are given relative to a nominal dose that has been established for a given exposure system and patterning material. In a different U.S. Pat. No. 5,740,068, Liebmann also discloses a method for performing optical proximity correction on the edge portions of the elements that affect the operational performance of the integrated circuits.

Just as with optical proximity effect, there have been numerous prior art proposals for correcting for E-beam proximity effect. As is well known, electron-beam provides radiant energy of shorter wavelengths than the relatively long wavelengths of visible and ultraviolet range, and hence making possible masks with finer resolution towards the implementation of even higher scale integration of semiconductor circuits. While E-beam lithography process is capable of superior feature resolution, that advantage is mitigated by the E-beam proximity effect caused by the back-scattering of electrons as the electrons impact the radiation sensitive resist, the underlying layers and the substrate. The back-scattering increases the effective exposure of portions of the resist layer, causing undesirable deviations from the original feature size. The back-scattering can be especially troublesome in closely-packed features such as in highly dense applications. This is illustrated in a top view of a substrate in FIG. 1b, which shows the variation in the width of stripes formed by scanning an E-beam across a substrate of FIG. 1a. In the cross-sectional view of the same substrate in FIG. 1a, elements (30a)–(30e) represent the instantaneous positions of the E-beam as it is being scanned across the surface of an e-beam sensitive resist layer (20) formed over the upper surface (12) of a semiconductor substrate (10) through methods well known in the art. Element (35c) is the path along which electrons travel or scatter forward corresponding to the position of the E-beam line at (30c). Path (35c) travels goes through the resist layer (20) and into the substrate (10). The E-beam at other positions similarly penetrate into the resist layer and the substrate. As the E-beam impacts atoms within the resist layer and within the crystal structure of substrate (10), a certain percentage of electrons are back-scattered to the resist layer (20) as suggested by arrows (37c). After developing the resist, it is found that the forward-scattered and back-scattered electrons together create an E-beam proximity effect (EPC) where the resulting stripes (20a)–(20e) shown in FIG. 1b have differing widths even though each E-beam location on the resist received the same energy. More specifically, centrally exposed stripe (20c) has the greatest width ($W_1$), while the adjacent stripes (20b), (20a) and (20d), (20e) further from the center have correspondingly smaller widths ($W_2$) and ($W_3$), as shown in FIG. 1b. This can be explained by the observation that the resist regions closer to the central area receive more back-scattered electrons than regions which are more peripheral with less surrounding area.

The additive proximity effect of the forward and back scattered electrons can also be seen by noting the equation (see, for example, Wolf, et al., "Silicon Processing for the VLSI Era," vol. 1, Lattice Press, Sunset Beach, Calif., 1990, p. 500) giving the energy density distribution in the resist as:

$$E(r)=k\{exp-(r/\sigma_f)^2+n(\sigma_f/\sigma_b)^2 exp-(r/\sigma_b)^2\}$$

where k is a proportionality constant, n is the ratio of total energy deposited by the forward scattered electrons, $\sigma_f$, $\sigma_b$ are the characteristic widths of the forward scattered and backward scattered Gaussian distribution, and r is the radial distance from the center of the E-beam spot. The parameters $\sigma_f$ and $\sigma_b$, and n vary with energy, while $\sigma_b$ and n also vary with substrate material. The adjustment of these three parameters with exposure and substrate conditions is used for proximity effect corrections in device patterning, or writing. Plots of forward-scatter profile and back-scatter profile are shown in FIG. 2a while the proximity effect resulting from the interaction between forward-scattered electrons and back-scattered electrons is shown in FIG. 2b. In both FIGS. 2a and 2b, the electron scatter or exposure intensity is plotted along the vertical axis; forward-scatter, and back-scatter are referenced by numerals (50) and (60), respectively, while the combined energy distribution is referenced by (70). Element (80) represents the clear-out energy, or the amount of dosage required to completely expose and later develop the total thickness of the e-beam sensitive resist.

Watson in U.S. Pat. No. 5,736,281 takes advantage of the dose profile to correct for proximity effect. An uncorrected dose profile is obtained for the pattern features to be introduced into the layer of electron beam sensitive material, including a determination of the clearing dose for the electron beam sensitive resist and the dose height for each edge of the pattern feature. Thereafter the incident dose of exposure energy for introducing an image of the pattern into a layer of electron beam sensitive material is adjusted by designating the clearing dose for each edge of the pattern feature as a function of the dose height. The uncorrected dose profile for determining the dose height and the clearing dose is optionally obtained from a calibration step. Each feature is optionally partitioned into a plurality of subshapes and the incident dose of exposure energy is then adjusted f or each edge of each subshape by designating the clearing dose for each edge of each subshape as a function of the dose height.

In addition to the compensation methods of adjusting the exposure dose for each subdivided shape, or adjusting the size of the design pattern, there is the method of chemically mobilizing the molecules of the e-beam resist so as to compensate for the exposure size variations caused by the proximity effect, as disclosed by Liu in U.S. Pat. No. 4,988,284.

Gaston, in U.S. Pat. No. 5,532,496, on the other hand, uses a combination of a scattering mask and a scattering filter to add automatic leveling background exposure and thus provide uniform contrast across the entire exposure pattern to compensate for the nonuniform resist exposure due to electron back-scattering from the underlying substrate during E-beam exposure. In another related application of the e-beam, Meisburger, et al., disclose in U.S. Pat. No. 5,665,968 an apparatus for inspecting optical masks using electron beam, and a method for automatically inspecting an optical mask in a separate U.S. Pat. No. 5,717,204.

Prior art addresses successfully the problems of optical proximity effect, and e-beam proximity effect; but individually and separately. Inasmuch as the advent of ultra large scale integration of circuits requires higher resolution processes, and that e-beam technology is poised to become one of the leading technologies to provide solutions for better resolution, it is prudent to take advantage of the existing compensation techniques for e-beam proximity effect and incorporate into it optical proximity effect as well as other general process effects (PE), such as due to etching, for example. In other words, what is needed is a method of covering all required process corrections by electron-beam correction, preferably at the time of the manufacturing of the mask, such as the binary mask (BIM) or the attenuated phase shifting mask (APSM), which is disclosed in the embodiments of this invention.

SUMMARY OF THE INVENTION

It is therefore an object of this invention to provide a method of correcting, or compensating for errors encountered in the transfer of patterns for use with high resolution e-beam lithography.

It is still another object of the present invention to provide a method of incorporating optical proximity effects into e-beam proximity effects by superimposing the two effects to arrive at a compensated dosage level data base to produce the desired patterns.

It is yet another object of this invention to provide a method of superimposing etching effects on the previous driving database by compensating the e-beam proximity data twice, that is, by over correcting it, to further improve the transfer of patterns without the undesirable effects.

These objects are accomplished by providing a mask substrate having a metal layer formed thereon; providing an electron-beam having a circular spot; forming a layer of e-beam sensitive resist over said metal layer; generating clear-out e-beam exposure dosage data for said e-beam sensitive resist; generating optical proximity e-beam exposure dosage data; superimposing said optical proximity e-beam exposure dosage data onto said resist clear-out dosage data to form a compensated data; generating an electron back-scatter data corresponding to said compensated data; superimposing said electron back-scatter data onto said compensated data to form an e-beam proximity data; e-beam exposure writing into said e-beam resist with said e-beam of circular spot using said e-beam proximity data; developing said e-beam resist to form a pattern corresponding to said e-beam proximity data in said e-beam resist; transferring said pattern from said e-beam resist into said metal layer by etching said metal; and removing said e-beam resist to complete the forming of the patterned metal layer.

In a second embodiment, these objects are further accomplished by also incorporating all key process errors, including optical as well as etching distortions, into the database for the electron-beam writing of the pattern into an e-beam sensitive resist material. Key pattern distortions prior to and subsequent to the e-beam writing are corrected, that is, compensated, at the time of the e-beam writing so that the final pattern is least distorted from its original pattern.

BRIEF DESCRIPTION OF THE DRAWINGS

FIG. 1a is a partial cross-sectional view of a semiconductor substrate showing the e-beam writing of the photoresist layer of prior art.

FIG. 1b is a top-view of the substrate of FIG. 1a showing the e-beam proximity effect of prior art.

FIG. 2a shows a plot of electron forward scattering and of electron back-scattering of prior art.

FIG. 2b shows a plot of the superimposition of electron forward scattering and electron back-scattering of prior art.

FIG. 3a is a partial cross-sectional view of a semiconductor substrate showing the lithographic exposure of a photoresist layer formed over the substrate of this invention.

FIG. 7d is a partial cross-sectional view of a semiconductor substrate showing the patterned metal layer of this invention with representative dimensions the same as or close to the original dimensions in FIG. 7a.

DESCRIPTION OF THE PREFERRED EMBODIMENTS

It is disclosed in this invention a proximity correction method in e-beam systems to correct optical proximity effect in photoresists. The method is applicable for binary masks (BIM) as well as attenuated phase shifting mask (APSM) for not only forming integrated circuit lines but also contact holes. Thus, the optical proximity effect is compensated by e-beam over-correction on the mask itself, where the critical dimensions (CDs) are varied as a function of the pattern density.

Reference is now made to FIG. 3a where a typical metal layer on a mask substrate, such as quartz, is to be patterned with a generic pattern. Substrate shown in FIG. 3a will first be patterned using current practices in the manufacturing line in order to point out the key aspects of patterning, and the same substrate will then be patterned using methods disclosed in the instant invention following FIGS. 7a–7d.

Figure 3B:
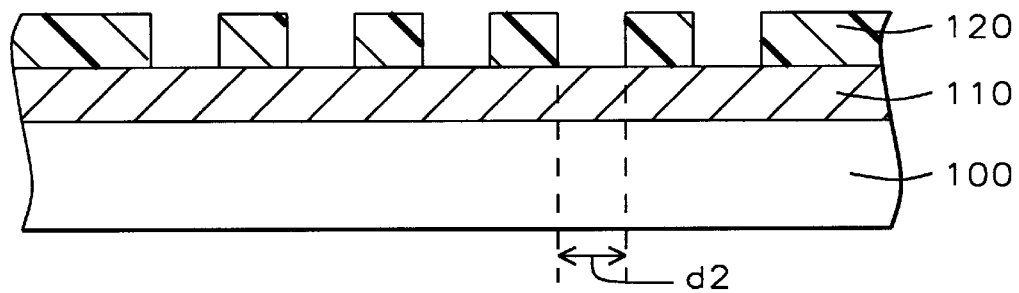
FIG. 3b is a partial cross-sectional view of a semiconductor substrate showing the forming of a pattern with a dimension different from its original dimension in the photoresist layer formed over the substrate according this invention.
Figure 3C:
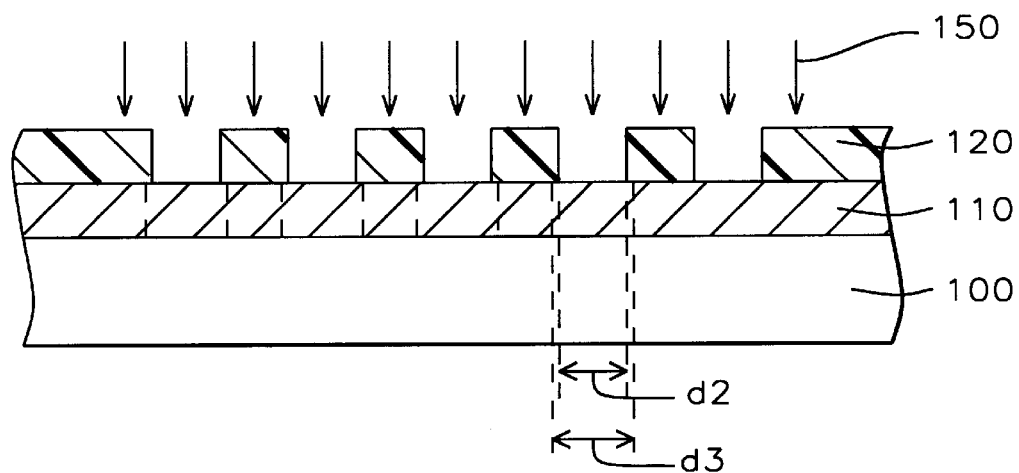
FIG. 3c is a partial cross-sectional view of a semiconductor substrate showing the etching of a pattern in a metal layer formed over the substrate according this invention.
Figure 3D:
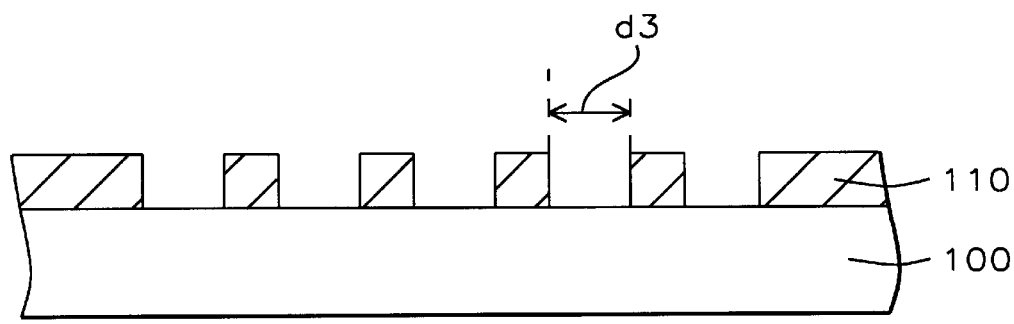
FIG. 3d is a partial cross-sectional view of a semiconductor substrate showing the etching of a pattern having a dimension different from its original dimension in a metal layer formed over the substrate according this invention.

In FIG. 3a, a substrate (100) is provided with a metal layer (110) to be patterned. The substrate here could be either a mask substrate, such as quartz metallized with chrome metal, or actually, a semiconductor substrate with a metal layer. A photomask (130), or a reticle, having the desired patterns is used to selectively illuminate a photoresist layer (120), formed on metal layer (110), using light (140). The transparent and opaque transmitting regions (135) of the photomask have the appropriate dimensions (d1) commensurate with the pattern to be imaged onto the photoresist layer (120). As schematically depicted by the arrows (140) in FIG. 3a, because of diffraction and diffusion of light through the apertures (135) in the quartz substrate, the area exposed on the photoresist acquires a dimension (d2) different from the original dimension (d1) of the pattern. Therefore, after the photoresist is developed and after either the exposed or protected regions of the photoresist is washed away (depending upon whether it is a positive or a negative resist, as is well known), the remaining patterns assume dimensions (d2) as shown in FIG. 3b. Now, the substrate is subjected to etching (150) through the patterns in the photoresist in order to form the generic pattern into the metal layer (110). However, depending upon the etchants used, and the metal layer as well as the features and density of the pattern, the dimensions of the etched pattern assumes a still different dimension, generically represented by (d3) in FIG. 3c.

A main feature and key aspect of the present invention is the incorporation of all key process errors, including optical as well as etching distortions, into the database for the electron-beam writing of the pattern into an e-beam sensitive resist material. In other words, key pattern distortions prior to and subsequent to the e-beam writing are corrected, that is, compensated, at the time of the e-beam writing so that the final pattern is least distorted from its original pattern. As is known in the art, optical lithography is limited to somewhat less than 1 micrometer ($\mu$m) resolution with a registration capability of ±0.3 μm. And it will be apparent to those skilled in the art that, by choosing e-beam lithography at the critical step of forming the resist pattern, with compensation for expected errors already factored in, the capability of the lithographic pattern transfer process is now being extended beyond these limits to a resolution of 0.150 μm with similar registration.

Now, referring first to FIGS. 7a–7d, a quartz substrate (100), such as in FIG. 3a, is provided with a metal layer (200) to be patterned. The quartz can also comprise shifter layers, as known in the art. For illustrative purposes, the patterning pertains to forming of line stripes on the metal layer, though the method is equally applicable to forming contact holes. It is preferred that the metal is chrome with a thickness between about 700 to 1050 Å, or phase shifter layer such as (MoSiON) having a thickness between about 815 to 915 Å.

A layer of photoresist (300) is formed over metal layer (200) using known techniques such as resist spinning. It is important that the resist used in this embodiment is sensitive to electron beam radiation and, preferably, it comprises ZEP 7000 made by Nippon Zeon. The preferred thickness of the e-beam resist is between about 0.3 to 0.7 μm.

Next, the e-beam sensitive resist is exposed to a scanning electron beam controlled by a numerically controlled or computer controlled e-beam machine. The beam spot is preferably of circular shape with a diameter between about 0.1 to 2 μm and the database that includes such parameters as the dwell time and dosage level to be administered at each spot are pre-loaded into the machine.

Figure 4A:
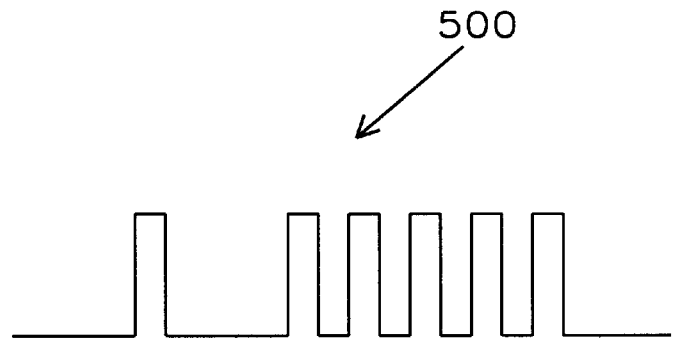
FIG. 4a is a plot of the e-beam dosage level without any correction or compensation, according to this invention.
Figure 4B:
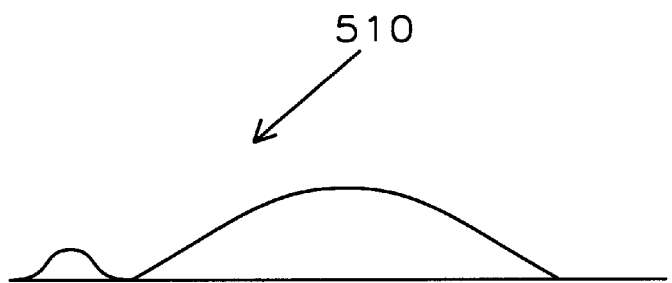
FIG. 4b is a plot of the electron back-scatter energy corresponding to the pattern of FIG. 4a, according to this invention.

FIG. 4a represents the height of the e-beam dosage level that would be needed to expose and clear out the total thickness of the e-beam resist layer (300) for the arbitrary pattern (500) shown in the same Figure. However, it has been determined both through theoretical calculations and experimental work that for the particular pattern shown and the thickness of the e-beam resist used, the back-scattered electron energy, encompassing any proximity effects, is given by FIG. 4b. Hence, the back-scatter energy data is superimposed on the clear-out energy level to arrive at the compensated e-beam proximity database (symbolically represented as (520) in FIG. 4c), which is used to drive the electron beam machine represented by the e-beams (400) of FIG. 7a. The phantom line (800) represents the minimum energy required to completely remove, or, clear out the e-beam resist after development.

Figure 4C:
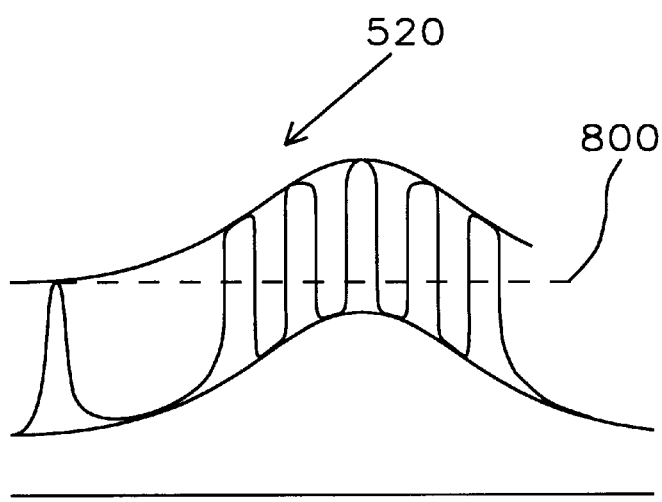
FIG. 4c is a plot of the e-beam proximity energy level corresponding to the uncorrected energy level of FIG. 4a and electron back-scatter energy of FIG. 4b, according to this invention.
Figure 5A:
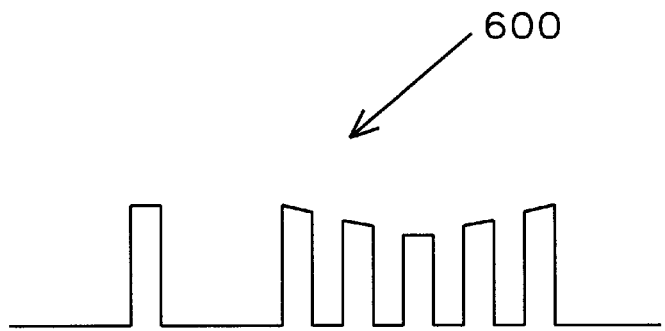
FIG. 5a is a plot of the e-beam dosage level with correction for e-beam proximity effect, according to this invention.
Figure 5B:
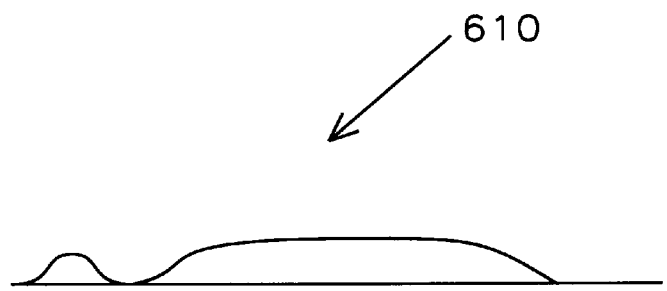
FIG. 5b is a plot of the electron back-scatter energy corresponding to the pattern of FIG. 5a, according to this invention.
Figure 5C:
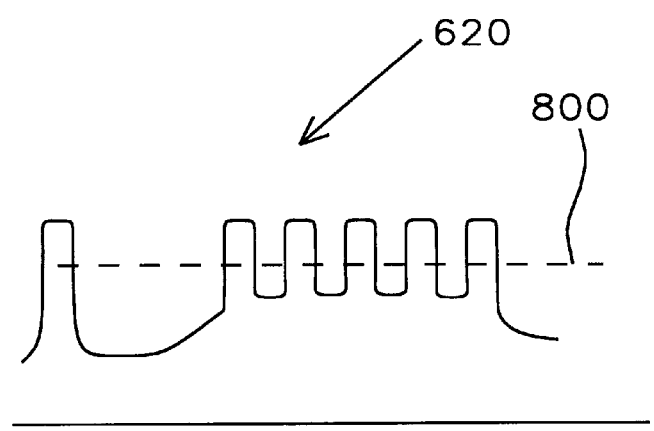
FIG. 5c is a plot of the e-beam proximity energy level corresponding to the corrected energy level of FIG. 5a and electron back-scatter energy of FIG. 5b, according to this invention.

It will be noted that using the database representing the energy or dosage level (520) of FIG. 4c without any further compensation for the optical proximity effects of the next step of photoresist lithography will result in only improved patterning to the extent of the better resolution of e-beam lithography compared to the photomask lithography used in FIGS. 3a–3d. However, the better resolution of e-beam lithography can be used to further advantage by incorporating into it other compensate process effects. It is therefore, a main feature and key aspect of the first embodiment of the present invention to compensate the e-beam database further for the optical proximity effects. Thus, the uncompensated data (500) of FIG. 4a is first compensated for the optical proximity effects as shown in FIG. 5a. The dosage level data (600) shown in FIG. 5a is generated based on feature analysis of the original pattern, features of the pattern being analyzed based on varying dimensions, distance to nearest neighbor, and any other geometrical parameter which affects the shape of the pattern. Preferably, this data is stored as look-up tables for future applications. Given the first compensated, or, corrected data represented symbolically by (600), the corresponding e-beam back-scatter data (610) is next generated using computations or experimentation, or both. This electron back-scatter data is then superimposed upon the first compensated data (600) to arrive at the final e-beam proximity data (620) of the first embodiment of the present invention. Here again, the phantom line (800) represents the minimum energy required to completely remove, or, clear out, the e-beam resist after development. The database corresponding to the dosage level in (620) is then used to drive the electron beams (400) shown in FIG. 7a.

Figure 6A:
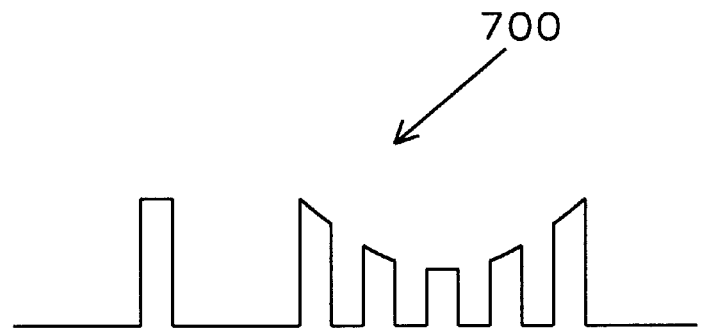
FIG. 6a is a plot of the e-beam dosage level with over correction for optical proximity effect, according to this invention.
Figure 6B:
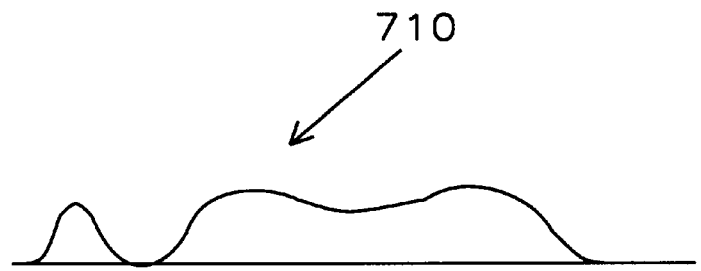
FIG. 6b is a plot of the electron back-scatter energy corresponding to the pattern of FIG. 6a, according to this invention.

In a second embodiment shown in FIGS. 6a–6b, not only is the optical proximity effect of resist lithography taken into account, but also the parameters affecting etching. Thus, the first compensated, or, corrected dosage level (600) of the first embodiment is compensated for the second time, or, over corrected to include the effects of such variables as etchant characteristics, biasing parameters and loading conditions. It will be appreciated that the necessary data can be generated through theoretical calculations, or experiments, or both. The resulting second compensated data for the second embodiment is symbolically represented as dosage height levels (700) shown in FIG. 6a. The electron back-scatter data corresponding to the second over corrected data (700) is then computed or empirically derived (710) as shown in FIG. 6b. The database corresponding to the dosage level in (720) is then used to drive the electron beams (400) shown in FIG. 7a.

Figure 6C:
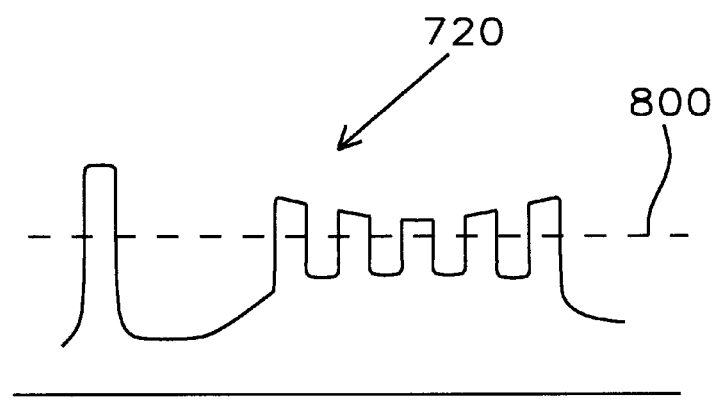
FIG. 6c is a plot of the e-beam proximity energy level corresponding to the over corrected energy level of FIG. 6a and electron back-scatter energy of FIG. 6b, according to this invention.
Figure 7A:
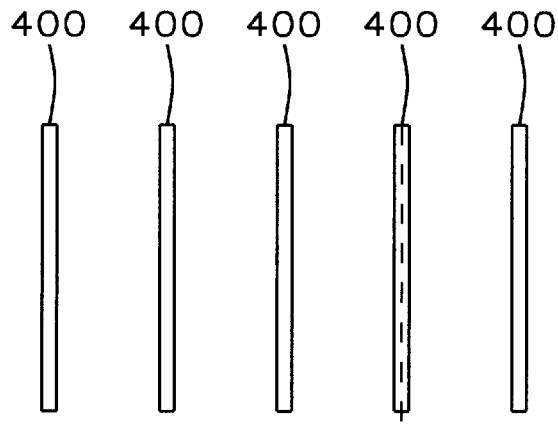
FIG. 7a is a partial cross-sectional view of a semiconductor substrate showing the e-beam exposure of an e-beam resist layer formed over the substrate of this invention.
Figure 7B:
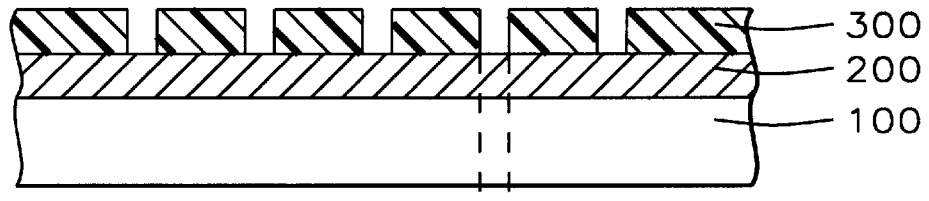
FIG. 7b is a partial cross-sectional view of a semiconductor substrate showing the forming of the e-beam pattern of FIG. 7a into resist layer formed over the substrate according this invention.
Figure 7C:
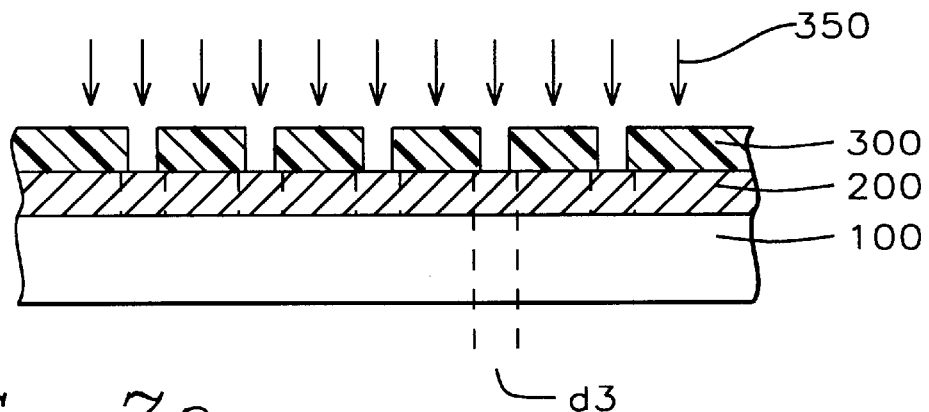
FIG. 7c is a partial cross-sectional view of a semiconductor substrate showing the etching of an e-beam pattern into a metal layer formed over the substrate according this invention.
Figure 7D:
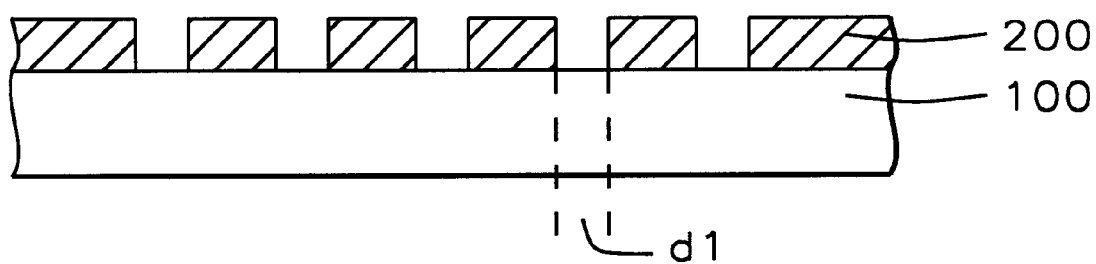

Referring once again to FIG. 7a, it is shown there electron beams (400) driven symbolically by database representing dosage level (720) shown in FIG. 6c, and for the purpose of creating a pattern having a representative dimension of (d1). Because the driving database has been compensated twice to over correct for lithographic deviations as well as for etching, the exposed and developed dimension in FIG. 7b is (d1'), different from (d1). However, after the etching (350) is performed as shown in FIG. 7c, the resulting dimension of the pattern is (d3'), or, very close to the original pattern dimension (d1), depending upon the accuracy of the compensated or corrected e-beam proximity data. Once the e-beam resist layer (300) is removed, the desired metal line pattern (200) is obtained as shown in FIG. 7d.

In FIGS. 7a–7d, it is preferred that the e-beam resist (300) is developed using a solution comprising diethyl ketone, diethyl malonate, methylisobutyl ketone and isopropyl alcohol. It is also preferred that the etching (350) shown in FIG. 7c, of the chrome metal is accomplished with a wet-etch recipe comprising $Cl(NH_4)_2(NO_3)_6$, or with a dry-etch recipe comprising plasma gases $CF_4+O_2$ or $SF_6+O_2$ for MoSiON metal.

Though these numerous details of the disclosed method were set forth above, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as when forming contact holes or via holes in the manufacture of masks or semiconductor devices. Furthermore, a raster type, in place of the scanning type of e-beam machine can also be used.

While the invention has been particularly shown and described with reference to the preferred embodiments thereof, it will be understood by those skilled in the art that various changes in form and details may be made without departing from the spirit and scope of the invention.

What is claimed is:

1. A method of e-beam over-correction to compensate optical proximity effect for a pattern formed in an optical lithography process comprising the steps of:

providing a mask substrate having a metal layer formed thereon;

providing an electron-beam having a circular spot;

forming a layer of e-beam sensitive resist over said metal layer;

generating clear-out e-beam exposure dosage data for said e-beam sensitive resist;

generating optical proximity e-beam exposure dosage data;

superimposing said optical proximity e-beam exposure dosage data onto said resist clear-out dosage data to form a compensated data;

generating an electron back-scatter data corresponding to said compensated data;

superimposing said electron back-scatter data onto said compensated data to form an e-beam proximity data;

e-beam exposure writing into said e-beam resist with said e-beam of circular spot using said e-beam proximity data;

developing said e-beam resist to form a pattern corresponding to said e-beam proximity data in said e-beam resist;

transferring said pattern from said e-beam resist into said metal layer by etching said metal; and removing said e-beam resist to complete the forming of the patterned metal layer.

2. The method of claim 1, wherein said substrate comprises quartz or quartz with phase shifter layers.

3. The method of claim 1, wherein said metal layer comprises chrome with a thickness between about 700 to 1050 Å, or phase shifter layer (MoSiON) having a thickness between about 815 to 915 Å.

4. The method of claim 1, wherein said electron-beam having a circular spot has a diameter between about 0.1 to 2 μm.

5. The method of claim 1, wherein said e-beam sensitive resist comprises ZEP 7000 made by Nippon Zeon.

6. The method of claim 1, wherein said e-beam sensitive resist has a thickness between about 0.3 to 0.7 μm.

7. The method of claim 1, wherein said clear-out e-beam exposure dosage data is generated based on the properties and thickness of said e-beam resist.

8. The method of claim 1, wherein said optical proximity e-beam exposure dosage data is generated based on feature analysis of said pattern, features of the pattern being analyzed based on varying dimensions, distance to nearest neighbor, and any geometrical parameter which affects the shape of said pattern.

9. The method of claim 1, wherein said superimposing said optical proximity e-beam exposure dosage data onto said resist clear-out dosage data to form a compensated data is accomplished by mathematically summing the corresponding dosage levels at each said e-beam spot.

10. The method of claim 1, wherein said generating an electron back-scatter data corresponding to said compensated data is accomplished by following a look-up table based on a previously established algorithm.

11. The method of claim 1, wherein said superimposing said electron back-scatter data onto said compensated data to form a e-beam proximity data is accomplished by mathematically summing the corresponding dosage levels at each said e-beam spot.

12. The method of claim 1, wherein said e-beam exposure writing into said e-beam resist with said e-beam of circular spot using said e-beam proximity data is accomplished by scanning said e-beam with an e-beam writing machine controlled by said e-beam proximity data.

13. The method of claim 1, wherein said developing said e-beam resist to form a pattern corresponding to said e-beam proximity data in said e-beam resist is accomplished with a solution comprising diethyl ketone, diethyl malonate, methylisobutyl ketone and isopropyl alcohol.

14. The method of claim 1, wherein said transferring said pattern from said e-beam resist into said metal layer by etching said metal is accomplished with a wet-etch recipe comprising $Cl(NH_4)_2(NO_3)_6$ for chrome metal, or with a dry-etch recipe comprising plasma gases $CF_4+O_2$ or $SF_6+O_2$ for MoSiON metal.

15. The method of claim 1, wherein said removing said e-beam resist to complete the forming of the patterned metal layer is accomplished by oxygen plasma ashing.

16. A method of e-beam over-correction to compensate optical proximity effect for a pattern formed in an optical lithography process comprising the steps of:

providing a substrate having a metal layer formed thereon;

providing an electron-beam having a circular spot;

forming a layer of e-beam sensitive resist over said metal layer;

generating clear-out e-beam exposure dosage data for said e-beam sensitive resist;

generating optical proximity e-beam exposure dosage data;

superimposing said optical proximity e-beam exposure dosage data onto said resist clear-out dosage data to form a first compensated data;

generating a metal etch biasing e-beam exposure dosage data;

superimposing said metal etch biasing e-beam exposure dosage data onto said first compensated data to form a second compensated data;

generating an electron back-scatter data corresponding to said second compensated data;

superimposing said electron back-scatter data onto said second compensated data to form an e-beam proximity data;

e-beam exposure writing into said e-beam resist with said e-beam of circular spot using said e-beam proximity data;

developing said e-beam resist to form a pattern corresponding to said e-beam proximity data in said e-beam resist;

transferring said pattern from said e-beam resist into said metal layer by etching said metal; and removing said e-beam resist to complete the forming of the patterned metal layer.

17. The method of claim 16, wherein said substrate comprises quartz or quartz with phase shifter layers.

18. The method of claim 16, wherein said metal layer comprises chrome with a thickness between about 700 to 1050 Å, or phase shifter layer (MoSiON) having a thickness between about 815 to 915 Å.

19. The method of claim 16, wherein said electron-beam having a circular spot has a diameter between about 0.1 to 2 μm.

20. The method of claim 16, wherein said e-beam sensitive resist comprises ZEP 7000 made by Nippon Zeon.

21. The method of claim 16, wherein said e-beam sensitive resist has a thickness between about 0.3 to 0.7 μm.

22. The method of claim 16, wherein said clear-out e-beam exposure dosage data is generated based on the properties and thickness of said e-beam resist.

23. The method of claim 16, wherein said optical proximity e-beam exposure dosage data is generated based on feature analysis of said pattern, features of the pattern being analyzed based on varying dimensions, distance to nearest neighbor, and any geometrical parameter which affects the shape of said pattern.

24. The method of claim 16, wherein said superimposing said optical proximity e-beam exposure dosage data onto said resist clear-out dosage data to form a first compensated data is accomplished by mathematically summing the corresponding dosage levels at each said e-beam spot.

25. The method of claim 16, wherein said generating a metal etch biasing e-beam exposure dosage data is accomplished by following a look-up table based on a previously established etch algorithm including over-etch and under-etch bias parameters.

26. The method of claim 16, wherein superimposing said metal etch biasing e-beam exposure dosage data onto said first compensated data to form a second compensated data is accomplished by mathematically summing the corresponding dosage levels at each said e-beam spot.

27. The method of claim 16, wherein said generating an electron back-scatter data corresponding to said second compensated data is accomplished by following a look-up table based on a previously established algorithm.

28. The method of claim 16, wherein said superimposing said electron back-scatter data onto said second compensated data to form an e-beam proximity data is accomplished by mathematically summing the corresponding dosage levels at each said e-beam spot.

29. The method of claim 16, wherein said e-beam exposure writing into said e-beam resist with said e-beam of circular spot using said e-beam proximity data is accomplished by scanning said e-beam with an e-beam writing machine.

30. The method of claim 16, wherein said developing said e-beam resist to form a pattern corresponding to said e-beam proximity data in said e-beam resist is accomplished with a solution comprising diethyl ketone, diethyl malonate, methylisobutyl ketone and isopropyl alcohol.

31. The method of claim 16, wherein said transferring said pattern from said e-beam resist into said metal layer by etching said metal is accomplished with wet-etch recipe comprising $Cl(NH_4)_2(NO_3)_6$ for chrome metal, or with a dry-etch recipe comprising plasma gases $CF_4+O_2$ or plasma gases $SF_6+O_2$ for MoSiON metal.

32. The method of claim 16, wherein said removing said e-beam resist to complete the forming of the patterned metal layer is accomplished by oxygen plasma ashing.

* * * * *